(12) United States Patent
Lin et al.

(10) Patent No.: US 6,413,793 B1
(45) Date of Patent: Jul. 2, 2002

(54) METHOD OF FORMING PROTRUSIONS ON SINGLE CRYSTAL SILICON STRUCTURES BUILT ON SILICON-ON-INSULATOR WAFERS

(75) Inventors: Chuang-Chia Lin, San Pablo, CA (US); Peter M. Gulvin, Webster, NY (US); Alex T. Tran, Madison, NJ (US); Nena Liakopoulos, Long Beach, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/858,469

(22) Filed: May 17, 2001

(51) Int. Cl.$^7$ ............................................. H01L 21/00
(52) U.S. Cl. ........................ 438/50; 438/52; 257/415; 257/417; 257/622
(58) Field of Search ................................. 257/622, 734, 257/415, 417; 438/50, 52

(56) References Cited

U.S. PATENT DOCUMENTS 5,747,353 A * 5/1998 Bashir et al. .................. 437/21
5,847,454 A * 12/1998 Shaw et al. .................. 257/734
5,882,532 A * 3/1999 Field et al. ..................... 216/2
6,291,875 B1 * 9/2001 Clark et al. .................. 257/622

* cited by examiner

Primary Examiner—David Nelms
Assistant Examiner—Tu-Tu Ho
(74) Attorney, Agent, or Firm—Oliff & Berridge PLC

(57) ABSTRACT

A semiconductor structure includes a substrate, a sacrificial layer formed on or over the substrate, and a structural layer formed on or over the sacrificial layer. At least one opening is formed in the structural layer. At least one opening is formed in the sacrificial layer below the at least one opening in the structural layer. The at least one opening in the structural layer and the at least one opening in the sacrificial layer are at least partially filled with a filler material. At least one portion of the structural layer is removed to define at least one microstructure. The sacrificial layer is removed such that the at least one microstructure is released from the substrate and the filler material forms one or more protrusions on the at least one microstructure, and/or one or more anchors anchoring the at least one microstructure to the substrate.

23 Claims, 4 Drawing Sheets

METHOD OF FORMING PROTRUSIONS ON SINGLE CRYSTAL SILICON STRUCTURES BUILT ON SILICON-ON-INSULATOR WAFERS

BACKGROUND OF THE INVENTION

1. Field of Invention

This invention is related to microelectromechanical systems (MEMS).

2. Description of Related Art

A common step in fabricating microstructures is a wet etching step to release a portion of the microstructures from a substrate. The etching step forms a "suspended" microstructure having a void or gap between the released portion of the microstructure and the substrate. The released portion of the microstructure is typically a beam or plate having top and bottom surfaces which are suspended substantially parallel with the surface of the substrate. Common suspended microstructures include cantilevered beams, double supported beams and plates suspended above a substrate by four supports. Devices which incorporate such suspended microstructures include accelerometers, pressure sensors, flow sensors, transducers, microactuators, and electrostatic comb drives.

One known method of forming suspended micromachined microstructures is generally termed surface-micromachining. Surface-micromachining involves additive forming of the microstructure over a substrate. For example, a sacrificial oxide layer, such as silicon dioxide, is deposited over the surface of a substrate of a wafer. The sacrificial oxide layer is selectively etched partially or completely through to the substrate to open up holes in the sacrificial oxide layer.

A thin film microstructure material, such as polysilicon, is deposited over the sacrificial layer. The microstructure material fills in the holes where the sacrificial layer was etched down to the substrate and contacts the substrate to form anchors for supporting the microstructure. The microstructure also fills in the holes where the sacrificial layer was not completely etched down to the substrate to form bumps on the bottom surface of the microstructure. Enough microstructure material is deposited to fill in completely the holes, as well as to form a uniform layer over the top of the sacrificial layer.

The microstructure material is then patterned into a desired shape by photolithography. Finally, the sacrificial layer is removed by, for example, wet etching, leaving behind a microstructure suspended above the substrate by the anchors.

In the micromachining process, the released portion of the microstructures often permanently adhere to the substrate after post-etch rinsing and drying procedures. This microstructure adhesion phenomenon is commonly referred to as stiction. Stiction reduces the micromachining process yield. The bumps on the bottom surface of the microstructure prevent stiction by preventing the microstructure from falling down onto the substrate.

SUMMARY OF THE INVENTION

Microstructures are often formed on silicon-on-insulator (SOI) structures. A silicon-on-insulator structure typically includes a silicon substrate, a buried oxide layer formed on top of the silicon substrate, and a single crystal silicon And (SCS) layer formed on top of the buried oxide layer. Forming microstructures on silicon-on-insulator structures provides significant advantages, such as superior electrical isolation between adjacent components, reduction of integrated circuit capacitance, and lower operating voltages.

Silicon-on-insulator structures are provided with the microstructure material already formed on the upper layer and the buried oxide layer formed as a continuous film below the microstructure material. Thus, conventional methods of forming microstructures having anchors and bumps can not be directly implemented.

It is possible to increase the size of the non-floating "anchor" such that some buried oxide remains intact during a timed selective buried oxide layer etch. However, this process significantly reduces device density. This is disadvantageous, because many emerging micro-devices require numerous, tightly-spaced, moving parts.

This invention provides methods of forming high density microstructures on silicon-on-insulator wafers.

This invention separately provides methods of forming dimples on single crystal silicon structures built on silicon-on-insulator wafers and structures incorporating such dimples.

This invention separately provides methods of forming anchors on single crystal silicon structures built on silicon-on-insulator wafers and structures incorporating such anchors.

Various exemplary embodiments of the methods, and the resulting structures, according to this invention comprise forming at least one opening in a structural layer of a semiconductor structure, forming an opening in a sacrificial layer of the semiconductor structure below the at least one opening in the structural layer, filling the opening in the structural layer and the opening in the sacrificial layer with a filler material, removing at least a portion of the structural layer to define at least one microstructure, and removing the sacrificial layer such that the at least one microstructure is released from the substrate and the filler material forms at least one protrusion on the at least one microstructure.

These and other features and advantages of the invention are described in, or are apparent from, the following detailed description of various exemplary embodiments of the methods according to this invention.

BRIEF DESCRIPTION OF THE DRAWINGS

Various exemplary embodiments of this invention will be described in detail, with reference to the following figures, wherein.

DETAILED DESCRIPTION OF EXEMPLARY EMBODIMENTS

Exemplary embodiments of the methods according to this invention provide a method of forming microstructures built on silicon-on-insulator wafers. The various exemplary embodiments of the methods according to this invention take advantage of the conformity of polysilicon deposition to fill trenches that are etched through the single crystal silicon layer. The trenches can be etched either completely through a buried oxide layer to the silicon-on-insulator substrate or partially through the buried oxide layer. The polysilicon fills in the trenches that have been etched completely through the buried oxide layer to form anchors that hold the single crystal silicon structure to the silicon-on-insulator substrate. The polysilicon also fills in the trenches that have been etched partially through the buried oxide layer to form dimples on the single crystal silicon structure.

First exemplary embodiments of the methods according to this invention also allow for the formation of dimples on the single crystal silicon structures built on the silicon-on-insulator wafers. The various exemplary embodiments of the methods according to this invention allow for using the dimples on the single crystal silicon structures to prevent stiction. Using dimples to prevent stiction has not previously been applicable to single crystal silicon structures built on silicon-on-insulator wafers because of the structure of the silicon-on-insulator wafer.

Second exemplary embodiments of the methods according to this invention allow for the formation of small and tightly spaced polysilicon anchors that link the single crystal silicon structures to the silicon-on-insulator substrates. The various exemplary embodiments of the methods according to this invention eliminates the need for large single crystal silicon anchor islands and enables high-density microstructures to be built on the silicon-on-insulator wafers.

Figure 1:
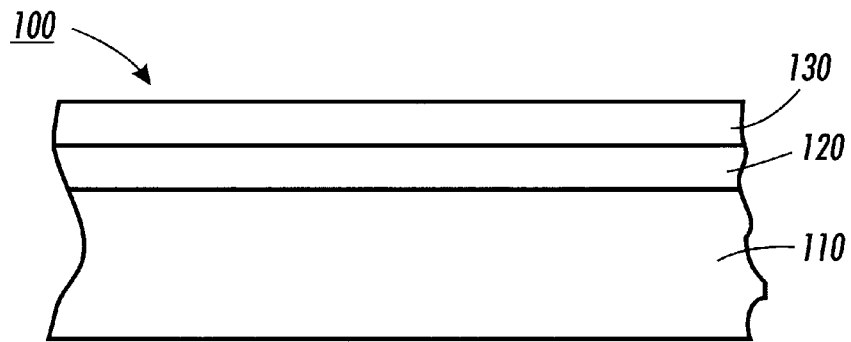
FIG. 1 illustrates a conventional silicon-on-insulator wafer structure.

FIG. 1 illustrates a conventional silicon-on-insulator wafer structure 100. The silicon-on-insulator wafer 100 includes a silicon substrate 110, a sacrificial layer 120, and a structural layer 130. The sacrificial layer 120 may be any suitable buried oxide layer or any other material that can be preferentially removed relative to the materials forming the substrate 110 and the structural layer 130. In various exemplary embodiments of the methods according to this invention, the structural layer 130 includes single crystal silicon. However, it should be appreciated that any suitable material can be used for the structural layer 130. For the purposes of this invention, the silicon-on-insulator wafer 100 may be formed using any known or later-discovered method, such the "wafer bonding" method, the separation by implanted oxygen (SIMOX) method, or the zone-melting recrystallization (ZMR) process.

Figure 2:
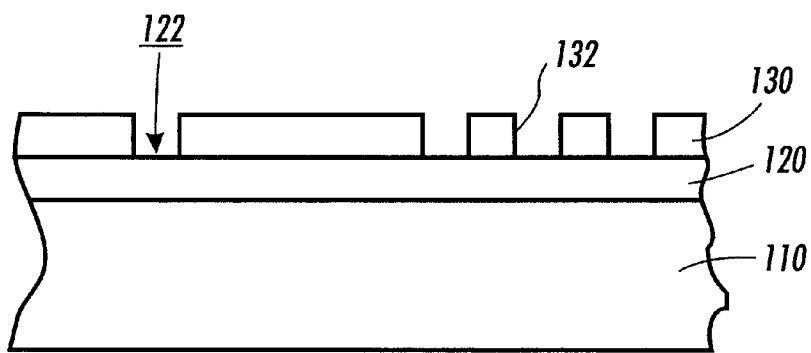
FIG. 2 illustrates a silicon-on-insulator wafer after a first step of various exemplary embodiments of the methods according to this invention has been performed on the silicon-on-insulator wafer.

FIG. 2 illustrates the silicon-on-insulator wafer 100 after a first step of various exemplary embodiments of the methods according to this invention have been performed on the silicon-on-insulator wafer 100. In this first step, one or more holes 132 are formed in the structural layer 130. The one or more holes 132 expose one or more corresponding areas 122 on the sacrificial layer 120. The one or more holes 132 are formed by any suitable technique, such as wet etching.

Figure 3:
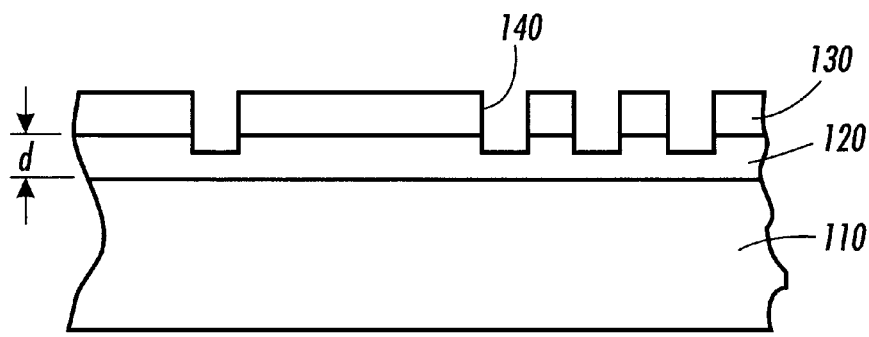
FIG. 3 illustrates a silicon-on-insulator wafer after a second step of a first exemplary embodiment of the methods according to this invention has been performed on the silicon-on-insulator wafer.

FIG. 3 illustrates the silicon-on-insulator wafer 100 after a second step of a first exemplary embodiment of the methods according to this invention has been performed on the silicon-on-insulator wafer 100. In this second step, the sacrificial layer 120 is removed at the one or more areas 122 to form one or more corresponding holes 140 extending through the structural layer 130 and the sacrificial layer 120. In various exemplary embodiments, the one or more corresponding holes 140 extend about halfway through the depth d of the sacrificial layer 120. However, it should be appreciated that the holes 140 can extend any suitable distance into the sacrificial layer 120 that is less than the depth d. The one or more corresponding holes 140 may be formed by any suitable technique, such as dry or wet etching.

Figure 4:
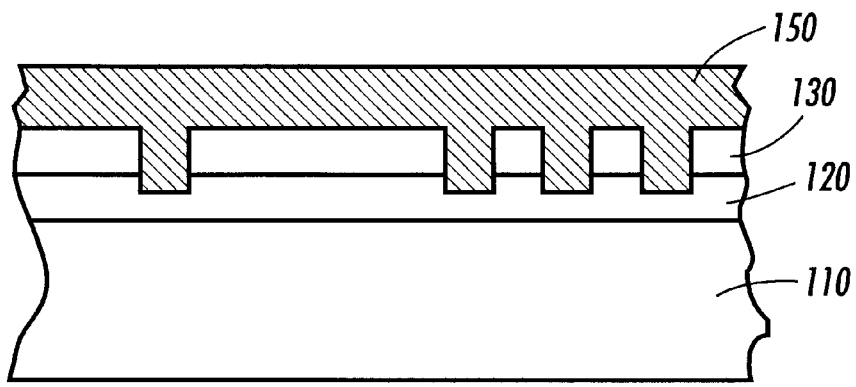
FIG. 4 illustrates a silicon-on-insulator wafer after a third step of the first exemplary embodiment of the methods according to this invention has been performed on the silicon-on-insulator wafer.

FIG. 4 illustrates the silicon-on-insulator wafer 100 after a third step of the first exemplary embodiment of the methods according to this invention has been performed on the silicon-on-insulator wafer 100. In this third step, a polysilicon layer 150 is deposited on or over the structural layer 130. The polysilicon layer 150 can be deposited using any suitable technique, such as chemical vapor deposition (CVD). Sufficient polysilicon is deposited on or over the structural layer 130 to assure the one or more holes 140 formed in the sacrificial layer 120 are sufficiently filled with polysilicon so that the polysilicon is chemically and/or mechanically attached to the structural layer 130, either directly or via one or more intervening material layers. In various exemplary embodiments, the polysilicon completely fills, or even overfills, the hole 140.

Figure 5:
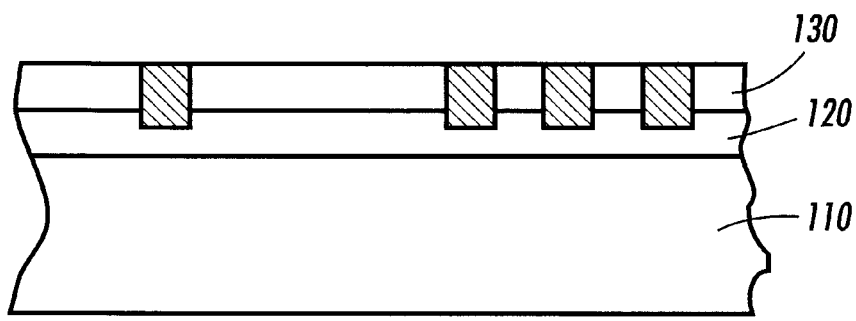
FIG. 5 illustrates a silicon-on-insulator wafer after a fourth step of the first exemplary embodiment of the methods according to this invention has been performed on the silicon-on-insulator wafer.

FIG. 5 illustrates the silicon-on-insulator wafer 100 after a fourth step of the first exemplary embodiment of the methods according to this invention has been performed on the silicon-on-insulator wafer 100. In this fifth step, any polysilicon that overflows out of the one or more holes 140 is removed from the top of the structural layer 130. The polysilicon can be removed by any suitable process, such as etching or mechanical or chemical polishing.

Figure 6:
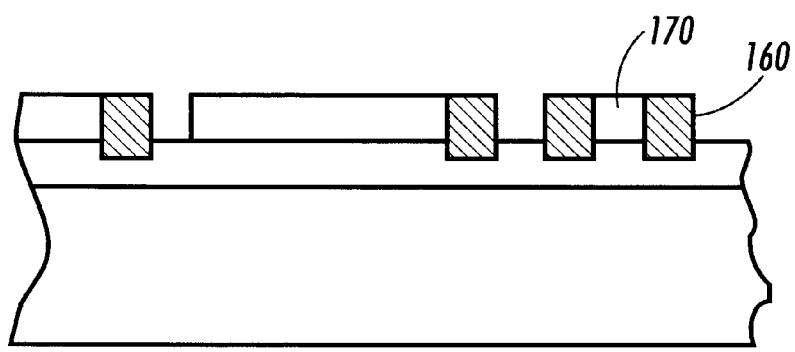
FIG. 6 illustrates a silicon-on-insulator wafer after a fifth step of the first exemplary embodiment of the methods according to this invention has been performed on the silicon-on-insulator wafer.

FIG. 6 illustrates the silicon-on-insulator wafer 100 after a fifth step of the first exemplary embodiment of the methods according to this invention has been performed on the silicon-on-insulator wafer 100. In this fifth step, portions of the structural layer 130 are removed to define individual microstructures 170. These portions of the structural layer 130 can be removed by any suitable technique, such as etching.

Figure 7:
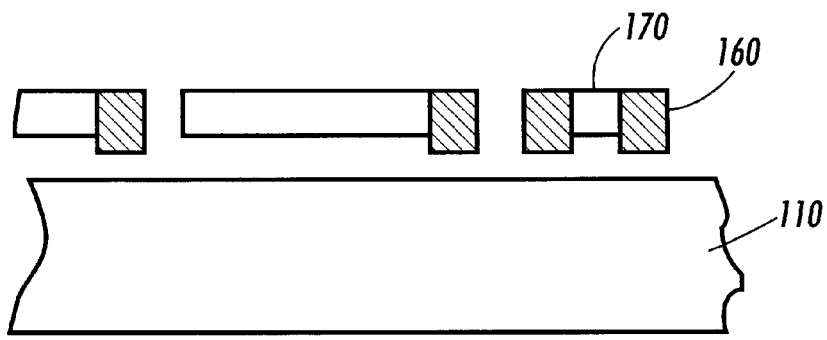
FIG. 7 illustrates a silicon-on-insulator wafer after a sixth step of the first exemplary embodiment of the methods according to this invention has been performed on the silicon-on-insulator wafer.

FIG. 7 illustrates the silicon-on-insulator wafer 100 after a sixth step of the first exemplary embodiment of the methods according to this invention has been performed on the silicon-on-insulator wafer 100. In this sixth step, the sacrificial layer 120 is removed to release the microstructures 170. The sacrificial layer 120 can be removed by any suitable process, such as by etching. The sacrificial layer 120 is typically a buried oxide layer, in which case a suitable etchant would be a hydrofluoric acid (HF)-based etchant. Although not shown in FIG. 7, portions of the sacrificial layer can be left behind so as to form anchors that attach the microstructures 170 to the silicon substrate 110. The microstructure 170 can also be anchored to the silicon substrate 110 using protrusions, as in other exemplary embodiments to be discussed later. The polysilicon that remains after the excess polysilicon is removed from the top of the structural layer 130 forms dimples 160 attached to sides of the microstructures 170 and extending closer to the substrate 110 then a bottom of the structural layer 130. It should be appreciated that, in other embodiments, the dimples 160 are formed in the middle portions of microstructures, rather than on the sides. The dimples 160 prevent the microstructures 170 from contacting the silicon substrate 110.

FIGS. 8–12 illustrate a second exemplary embodiment of the methods according to this invention. The first step in the second exemplary embodiment of the methods according to this invention is the same as the first step in the first embodiment. Specifically, as illustrated in FIG. 2, in the first step of the second exemplary embodiment of the methods according to this invention, the one or more holes 132 are formed in the structural layer 130 of the silicon-on-insulator wafer 100. The one or more holes 132 expose the one or more corresponding areas 122 on the sacrificial layer 120.

Figure 8:
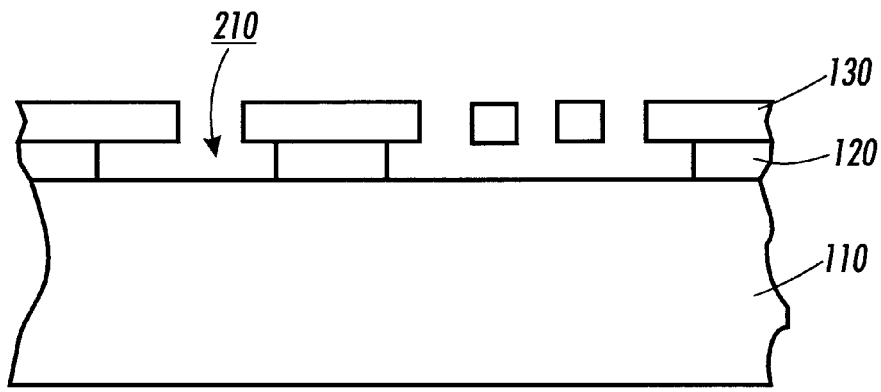
FIG. 8 illustrates a silicon-on-insulator wafer after a second step of a second exemplary embodiment of the methods according to this invention has been performed on the silicon-on-insulator wafer.

FIG. 8 illustrates the silicon-on-insulator wafer 100 after a second step of the second exemplary embodiment of the methods according to this invention has been performed on the silicon-on-insulator wafer 100. In this second step, the sacrificial layer 120 is removed at the areas 122 to form one or more corresponding holes 210 extending through the structural layer 130 and the sacrificial layer 120. The one or more corresponding holes 210 extend completely through the depth d of the sacrificial layer 120. The one or more corresponding holes 210 may be formed by any suitable technique, such as dry or wet etching.

Figure 9:
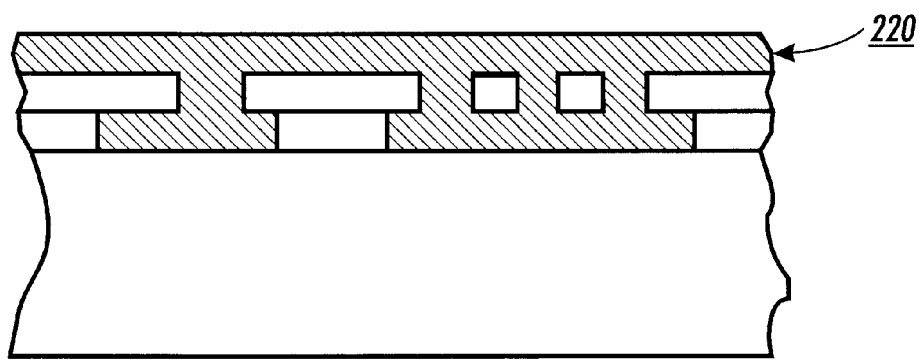
FIG. 9 illustrates a silicon-on-insulator wafer after a third step of the second exemplary embodiment of the methods according to this invention has been performed on the silicon-on-insulator wafer.

FIG. 9 illustrates the silicon-on-insulator wafer 100 after a third step of the second exemplary embodiment of the methods according to this invention has been performed on the silicon-on-insulator wafer 100. In. this third step, a polysilicon layer 220 is deposited on the structural layer 130. The polysilicon layer 220 can be deposited by any suitable technique, such as chemical vapor deposition (CVD). Sufficient polysilicon is deposited on or over the structural layer 130 to assure the one or more holes 210 formed in the sacrificial layer 120 are sufficiently filled with polysilicon so that the polysilicon is chemically and/or mechanically attached to the structural layer 130, either directly or via one or more intervening material layers. In various exemplary embodiments, the polysilicon completely fills, or even overfills, the hole 140.

Figure 10:
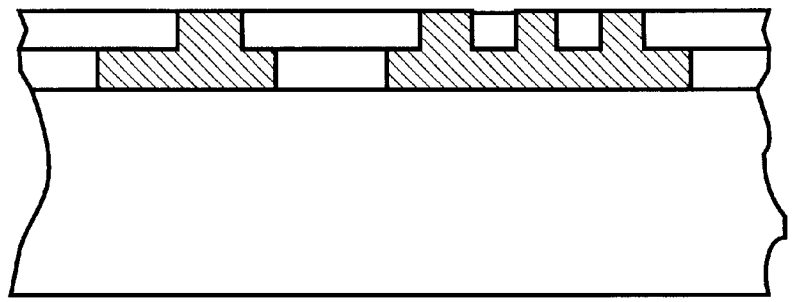
FIG. 10 illustrates a silicon-on-insulator wafer after a fourth step of the second exemplary embodiment of the methods according to this invention has been performed on the silicon-on-insulator wafer.

FIG. 10 illustrates the silicon-on-insulator wafer 100 after a fourth step of the second exemplary embodiment of the methods according to this invention has been performed on the silicon-on-insulator wafer 100. In this fourth step, any polysilicon that overflows out of the one or more holes 210 is removed from the top of the structural layer 130. The polysilicon can be removed by any suitable process, such as etching or mechanical or chemical polishing.

Figure 11:
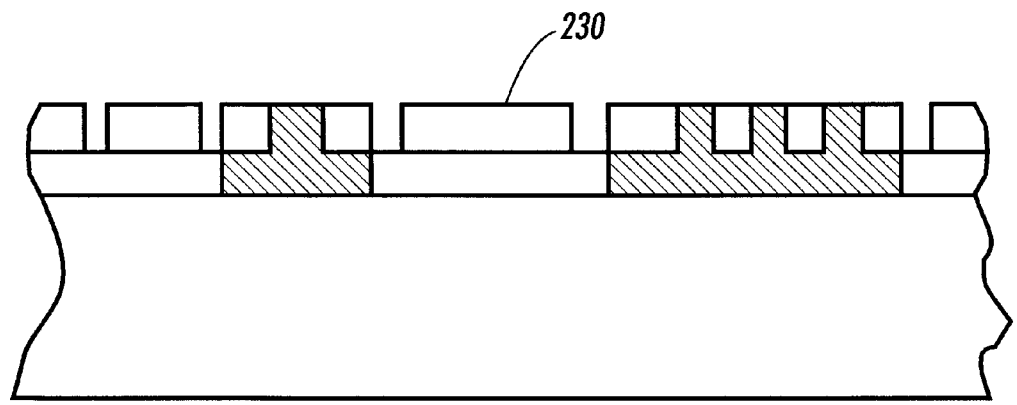
FIG. 11 illustrates a silicon-on-insulator wafer after a fifth step of the second exemplary embodiment of the methods according to this invention has been performed on the silicon-on-insulator wafer.

FIG. 11 illustrates the silicon-on-insulator wafer 100 after a fifth step of the second exemplary embodiment of the methods according to this invention has been performed on the silicon-on-insulator wafer 100. In this fifth step, portions of the structural layer 130 are removed to define individual microstructures 230. These portions of the structural layer 130 can be removed to form microstructures 230 by any suitable technique, such as etching.

Figure 12:
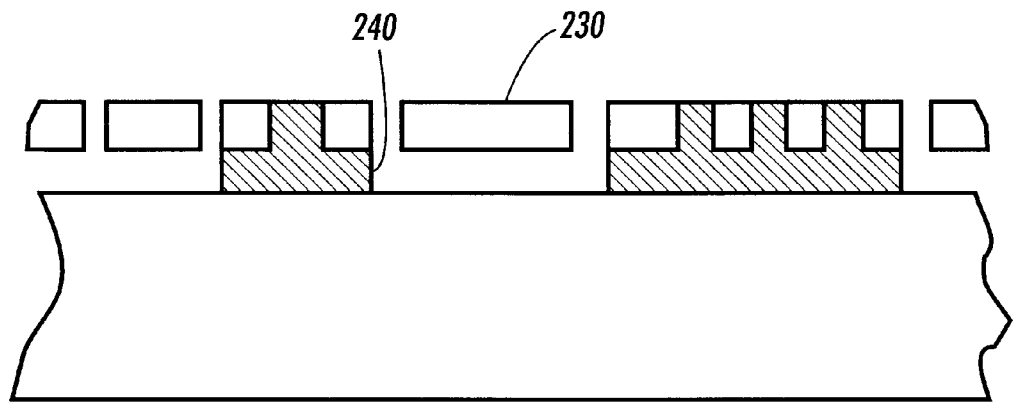
FIG. 12 illustrates a silicon-on-insulator wafer after a sixth step of the second exemplary embodiment of the methods according to this invention has been performed on the silicon-on-insulator wafer.

FIG. 12 illustrates the silicon-on-insulator wafer 100 after a sixth step of the second exemplary embodiment of the methods according to this invention has been performed on the silicon-on-insulator wafer 100. In this sixth step, the sacrificial layer 120 is removed to release the microstructures 230. The sacrificial layer 120 can be removed by any suitable process, such as by etching. The remaining polysilicon on the substrate 110 forms one or more anchors 240. The one or more anchors 240 connect the microstructures 230 to the substrate 110.

While this invention has been described in conjunction with the specific exemplary embodiments outlined above, it is evident that many alternatives, modifications and variations will be apparent to those skilled in the art. Accordingly, the exemplary embodiments of the invention, as set forth above, are intended to be illustrative, not limiting. Various changes may be made without departing from the spirit and scope of the invention.

What is claimed is:

1. A method of forming at least one microstructure from a semiconductor structure, the semiconductor structure including a substrate, a sacrificial layer formed on or over the substrate, and a structural layer formed on or over the sacrificial layer, the method comprising:

forming at least one opening in the structural layer;

forming at least one opening in the sacrificial layer below the at least one opening in the structural layer;

filling the at least one opening in the structural layer with a filler material;

removing at least a portion of the structural layer to define at least one microstructure; and removing the sacrificial layer such that the at least one microstructure is released from the substrate and the filler material forms at least one protrusion extending from the at least one microstructure towards the substrate.

2. The method of claim 1, wherein forming at least one opening in the sacrificial layer comprises forming the at least one opening extending completely through a thickness of the sacrificial layer.

3. The method of claim 2, wherein at least one of the at least one protrusion on the at least one microstructure is an anchor that connects at least one of the at least one microstructure to the substrate.

4. The method of claim 1, wherein forming at least one opening in the sacrificial layer comprises forming the at least one opening extending partially through a thickness of the sacrificial layer.

5. The method of claim 4, wherein at least one of the at least one protrusion on the at least one microstructure is a dimple that prevents at least one of the at least one microstructure from contacting the substrate.

6. The method of claim 1, wherein the filler material comprises polysilicon.

7. The method of claim 1, wherein the substrate comprises silicon.

8. The method of claim 1, wherein the sacrificial layer comprises a buried oxide layer.

9. The method of claim 1, wherein the structural layer comprises single crystal silicon.

10. The method of claim 1, wherein forming the at least one opening in the structural layer includes etching at least one opening into the structural layer.

11. The method of claim 1, wherein forming the at least one opening in the sacrificial layer includes etching the at least one opening into the sacrificial layer.

12. The method of claim 1, wherein filling the at least one opening includes depositing filler on the structural layer such that the at least one opening in the sacrificial layer is filled with filler and the filler is attached to the structural layer and forms a filler layer on the structural layer.

13. The method of claim 12, further comprising removing a portion of the filler layer.

14. The method of claim 13, wherein removing the portion of the filler layer includes etching the filler layer.

15. The method of claim 13, wherein removing the portion of the filler layer includes polishing the filler layer.

16. The method of claim 1, wherein removing the at least one portion of the structural layer comprises etching the at least one portion of the structural layer.

17. The method of claim 1, wherein removing the sacrificial layer comprises etching the sacrificial layer.

18. A microstructure formed by the method of claim 1.

19. A semiconductor structure, comprising:
   a substrate;
   at least one microstructure formed on or over the substrate;
   at least one protrusion extending from the at least one microstructure towards the substrate, the at least one protrusion comprising polysilicon.

20. The semiconductor structure of claim 19, wherein the at least one protrusion connects the at least one microstructure to the substrate to form at least one anchor.

21. The semiconductor structure of claim 19, wherein the at least one protrusion prevents the at least one microstructure from contacting the substrate.

22. The semiconductor structure of claim 19, wherein the substrate comprises silicon.

23. The semiconductor structure of claim 19, wherein the at least one microstructure comprises single crystal silicon.

* * * * *

UNITED STATES PATENT AND TRADEMARK OFFICE
CERTIFICATE OF CORRECTION

PATENT NO. : 6,413,793 B1  Page 1 of 1
DATED : July 2, 2002
INVENTOR(S) : Lin et al.

It is certified that error appears in the above-identified patent and that said Letters Patent is hereby corrected as shown below:

<u>Column 1,</u>
Line 5, insert:
-- This invention was made with United States Government support under Agreement No. 70NANB8H4014 awarded by NIST. The United States Government has certain rights in this invention. --.

Signed and Sealed this

Thirtieth Day of May, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,413,793 B1 | Page 1 of 1 |
| APPLICATION NO. | : 09/858469 | |
| DATED | : July 2, 2002 | |
| INVENTOR(S) | : Chuang-Chia Lin et al. | |

It is certified that error appears in the above-identified patent and that said Letters Patent is hereby corrected as shown below:

In the Specification

Col. 1, between lines 6 and 7, insert the following new paragraph:

--This invention was made with Government support under 70NANB8H4014 awarded by NIST. The Government has certain rights in this invention.--

Signed and Sealed this
First Day of April, 2014

Michelle K. Lee
*Deputy Director of the United States Patent and Trademark Office*